United States Patent
Jo et al.

(10) Patent No.: US 9,888,582 B2
(45) Date of Patent: Feb. 6, 2018

(54) DISPLAY DEVICE

(71) Applicant: SAMSUNG DISPLAY CO., LTD., Yongin, Gyeonggi-Do (KR)

(72) Inventors: Kang Moon Jo, Seoul (KR); Se Hyoung Cho, Hwaseong-si (KR); Kyung-Hoon Kim, Uiwang-si (KR); Dong Woo Kim, Seongnam-si (KR); Il Gon Kim, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 210 days.

(21) Appl. No.: 14/842,338

(22) Filed: Sep. 1, 2015

(65) Prior Publication Data

US 2016/0219706 A1    Jul. 28, 2016

(30) Foreign Application Priority Data

Jan. 22, 2015   (KR) .......................... 10-2015-0010845

(51) Int. Cl.
| | | |
|---|---|---|
| *H05K 1/00* | (2006.01) | |
| *H05K 3/36* | (2006.01) | |
| *H05K 1/11* | (2006.01) | |
| *H05K 3/32* | (2006.01) | |

(52) U.S. Cl.
CPC .............. *H05K 3/361* (2013.01); *H05K 1/118* (2013.01); *H05K 3/323* (2013.01); *H05K 2201/09063* (2013.01); *H05K 2201/09172* (2013.01); *H05K 2201/09418* (2013.01); *H05K 2201/10128* (2013.01)

(58) Field of Classification Search
CPC ......... H05K 1/118; H05K 2201/09063; H05K 2201/09172; H05K 2201/09418; H05K 2201/10128; H05K 3/323; H05K 3/361
See application file for complete search history.

(56) References Cited

U.S. PATENT DOCUMENTS

| | | | |
|---|---|---|---|
| 5,453,913 A | * | 9/1995 | Koyanagi ......... H01L 23/49572 |
| | | | 174/262 |
| 5,587,557 A | | 12/1996 | Kurihara et al. |
| 5,951,304 A | * | 9/1999 | Wildes ................. B81B 7/0006 |
| | | | 174/261 |
| 7,109,575 B2 | | 9/2006 | Kang et al. |
| 2005/0083475 A1 | | 4/2005 | Hsu |

(Continued)

FOREIGN PATENT DOCUMENTS

| | | |
|---|---|---|
| EP | 0 645 949 A2 | 3/1995 |
| JP | 04352132 * | 12/1992 |

(Continued)

*Primary Examiner* — Yuriy Semenenko
(74) *Attorney, Agent, or Firm* — Lee & Morse, P.C.

(57) ABSTRACT

A display device including a flexible substrate that includes a display part to display an image; a driving integrated chip (IC) that supplies a driving voltage to the display part; a flexible printed circuit (FPC) attached to an outer side portion of the substrate; and a printed circuit board (PCB) attached to the FPC, the PCB transferring the driving voltage to the driving IC through the FPC, wherein the FPC includes attachment parts at ends thereof, the attachment parts of the FPC being attached to pad parts at the outer side portion of the substrate and to pad parts of the PCB, and the attachment parts include slits therein.

14 Claims, 8 Drawing Sheets

(56) References Cited

U.S. PATENT DOCUMENTS

| | | | | |
|---|---|---|---|---|
| 2006/0267971 | A1* | 11/2006 | Yoo | C25D 5/02 345/206 |
| 2009/0148678 | A1* | 6/2009 | Hwang | H05K 1/0281 428/209 |
| 2009/0194342 | A1* | 8/2009 | Kuo | G06F 3/0412 178/18.03 |
| 2015/0173171 | A1* | 6/2015 | Kim | H05K 1/028 361/749 |
| 2015/0189768 | A1* | 7/2015 | Kishida | H05K 1/028 361/749 |

FOREIGN PATENT DOCUMENTS

| | | |
|---|---|---|
| JP | 2002-156917 A | 5/2002 |
| JP | 2007-053401 A | 3/2007 |
| KR | 10-0135937 B1 | 4/1998 |
| KR | 10-0333169 B1 | 4/2002 |
| KR | 10-2010-0109524 A | 10/2010 |

\* cited by examiner

DISPLAY DEVICE

CROSS-REFERENCE TO RELATED APPLICATION

Korean Patent Application No. 10-2015-0010845, filed on Jan. 22, 2015, in the Korean Intellectual Property Office, and entitled: "Display Device," is incorporated by reference herein in its entirety.

BACKGROUND

1. Field

Embodiments relate to a display device.

2. Description of the Related Art

In accordance with the development of a display device, a flexible display device that may be bent, folded, or rolled in itself has been recently considered.

A display device that may provide stereoscopic feeling to an image through a screen having a curved form has also been considered.

The flexible display device may be manufactured using a flexible plastic substrate made of low temperature poly silicon (LTPS), polyimide, or the like.

A pixel array may be formed on the flexible plastic substrate, and may include data lines and gate lines formed so as to intersect with each other, thin film transistors (TFTs), and pixel electrodes.

A driver integrated circuit (IC) (for supplying driving signals and voltages to the pixel array) may be formed at an outer side portion of the flexible plastic substrate.

For example, the driver IC may include a gate driver IC and a data driver IC, and may be formed in a chip on glass (COG) scheme, a chip on plastic (COP) scheme, or a chip on film (COF) scheme.

In addition, a printed circuit board (PCB) (having a driving circuit part other than the driver IC) may be connected to the substrate using a flexible printed circuit (FPC).

The driver IC may be connected to pads formed on the substrate through a plurality of bumps to supply a driving voltage VCC, a ground voltage GND, data output signals, and to enable signals to the pixel array of the substrate.

The above information disclosed in this Background section is only for enhancement of understanding of the background of the described technology and therefore it may contain information that does not form the prior art that is already known in this country to a person of ordinary skill in the art.

SUMMARY

Embodiments are directed to a display device.

The embodiments may be realized by providing a display device including a flexible substrate that includes a display part to display an image; a driving integrated chip (IC) that supplies a driving voltage to the display part; a flexible printed circuit (FPC) attached to an outer side portion of the substrate; and a printed circuit board (PCB) attached to the FPC, the PCB transferring the driving voltage to the driving IC through the FPC, wherein the FPC includes attachment parts at ends thereof, the attachment parts of the FPC being attached to pad parts at the outer side portion of the substrate and to pad parts of the PCB, and the attachment parts include slits therein:

The slits may be provided such that the slits cut into the attachment parts and the attachment parts are divided into a plurality of parts.

The attachment parts may include a plurality of bumps thereon, the plurality of bumps extending in a lengthwise direction, the pad part may include a plurality of pads, the plurality of pads having a shape corresponding to a shape of the bumps and being attached to the bumps, and the slits may be between the bumps.

An extension direction of the bumps may be inclined relative to an edge of the FPC.

The slits may have a wedge shape in which sides thereof are inclined relative to one another, and the extension direction of bumps may be substantially parallel with the sides of the slits adjacent to the bumps.

The slits may have a substantially elliptical shape having curved sides, and at least one of the bumps may be curved so as to correspond to the curved sides of the slits adjacent thereto.

The slits may have a substantially polygonal shape having bent sides, and at least one of the bumps may be bent so as to correspond to the bent sides of the slits adjacent thereto.

The pad part and the attachment part may be electrically connected to each other by an anisotropic conductive film (ACF).

One end of the FPC may be on one surface of the substrate and another end of the FPC is on another, opposite surface of the substrate.

The attachment part may be attached to the substrate in a region in which the substrate is curved.

The driving IC may be positioned on the FPC.

The driving IC may be positioned at the outer side portion of the substrate.

The display device may include any one of a liquid crystal display (LCD), a plasma display panel (PDP), an organic light emitting diode (OLED) device, a field effect display (FED), and an electrophoretic display device.

The display device may have a curved shape or may have flexibility.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
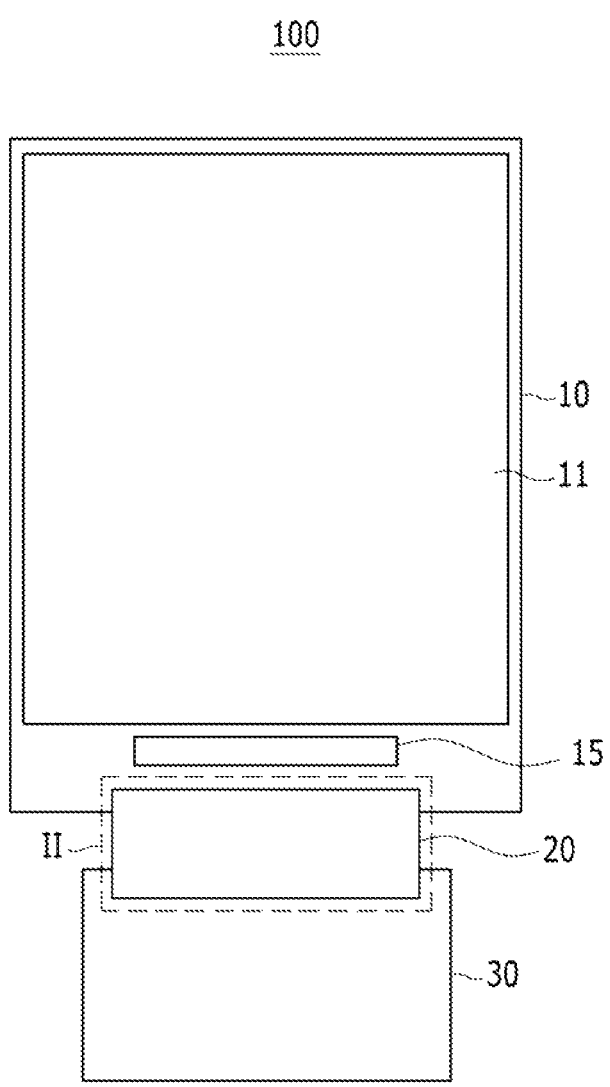
FIG. 1 illustrates a plan view schematically showing a structure of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present.

In addition, throughout the present specification, unless explicitly described to the contrary, the word "comprise" and variations such as "comprises," "includes, "comprising," or "including," will be understood to imply the inclusion of stated elements but not the exclusion of any other elements. In addition, throughout the specification, the word "on" does not necessarily mean that any element is positioned at an upper side based on a gravity direction, but means that any element is positioned above or below a target portion.

Hereinafter, a configuration of a display device according to an exemplary embodiment will be described in detail with reference to the accompanying drawings.

Figure 2:
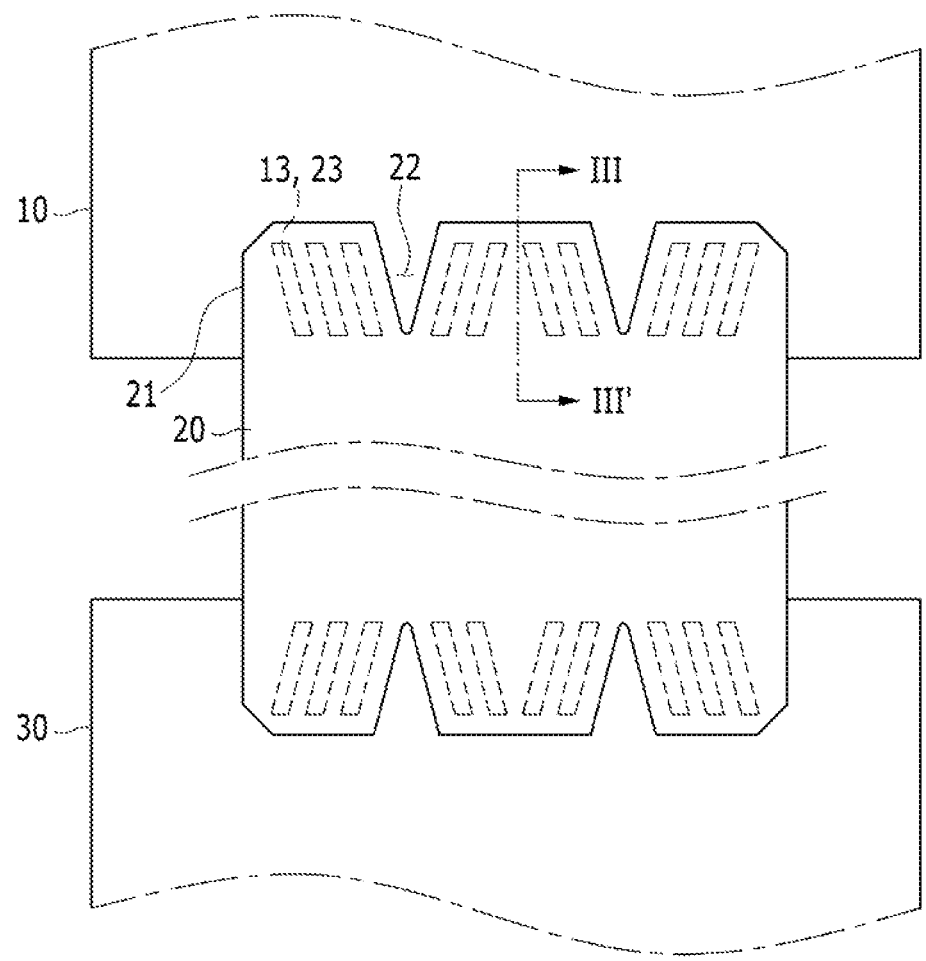
FIG. 2 illustrates an enlarged view of part II of FIG. 1.
Figure 3:
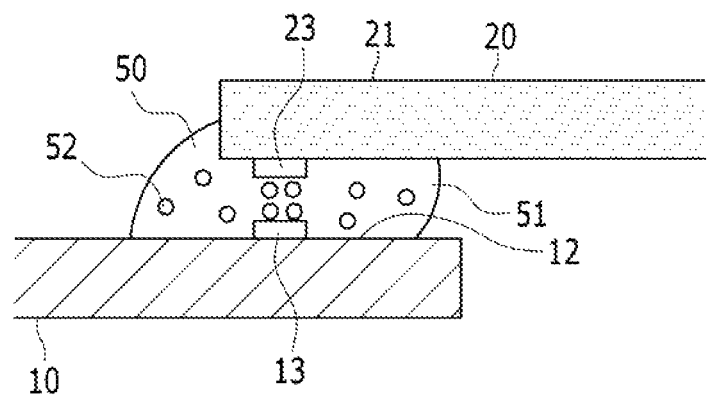
FIG. 3 illustrates a cross-sectional view taken along line III-III' of FIG. 2.

FIG. 1 illustrates a plan view schematically showing a structure of a display device according to an exemplary embodiment. FIG. 2 illustrates an enlarged view of part II of FIG. 1. FIG. 3 illustrates a cross-sectional view taken along line III-III' of FIG. 2.

Here, FIG. 1 schematically illustrates a connection structure before a flexible printed circuit (FPC) (attached to a substrate of the display device) is bent.

The display device 100 according to an exemplary embodiment may include a substrate 10 and a driving integrated chip (IC) 15. The driving IC may be positioned at an outer side portion of the substrate 10 and may be connected to a display part 11 of the substrate 10 to supply a driving voltage.

In addition, an FPC 20 may be attached to the outer side portion or end of the substrate 10, and a printed circuit board (PCB) (transferring the driving voltage to the driving IC 15) may be attached to the FPC 20.

The substrate 10 may be a flexible substrate coated with a plastic material, e.g., low temperature poly silicon (LTPS), polyimide, or the like, to have flexibility.

In an implementation, a pixel array may be formed on the display part 11 of the flexible substrate 10.

The pixel array may include a plurality of data lines and a plurality of gate lines formed so as to intersect with each other, thin film transistors, and pixel electrodes.

The driving IC 15 (supplying the driving voltage to the display part 11 of the substrate 10) may be disposed at the outer side portion or end of the substrate 10.

The driving IC 15 may include a circuit chip or the like mounted therein, and a driving signal from the PCB 30 may be transferred through the FPC 20, converted by the driving IC 15, and supplied to the display part.

In an implementation, the driving IC 15 may be disposed at the outer side portion of the substrate 10. In an implementation, the driving IC 15 may be mounted in or on the FPC 20.

Referring to FIGS. 1 and 2, one side of the FPC 20 may be attached to the outer side portion of the substrate 10, and another side thereof may be attached to the PCB 30.

For example, attachment parts 21 at end portions, e.g., both end portions, of the FPC 20 may be attached to pad parts on the outer side portion of the substrate 10 and pad parts on the PCB 30.

Referring to FIGS. 2 and 3, the pad part 12 of the substrate 10 may include a plurality of, e.g., conductive, pads 13, and the attachment part 21 of the FPC 20 may include a plurality of, e.g., conductive, bumps 23.

For example, the pads 13 and the bumps 23 may be provided on inner side surfaces of the substrate 10 and the FPC 20, respectively, and may be attached or coupled to each other so as to face each other.

Referring to FIG. 3, an anisotropic conductive film (ACF) 50 may be filled in attachment portions between the substrate 10 and the FPC 20, and may then be hardened to electrically connect the pads 13 of the substrate 10 with the bumps 23 of the FPC 20.

The anisotropic conductive film 50 may include a polymer 51 and conductive particles 52 contained in the polymer 51.

The anisotropic conductive film 50 may facilitate connecting the pad part 12 of the substrate 10 and the attachment part 21 of the FPC 20 at a melting temperature of about 165° C. to about 175° C.

In a process in which the polymer 51 of the anisotropic conductive film 50 is hardened, the conductive particles 52 may be disposed between the pad 13 of the substrate 10 and the bump 23 of the FPC 20, such that the substrate 10 and the FPC 20 are electrically connected to each other through the conductive particles 52.

In an implementation, the pads 13 and the bumps 23 may be provided in forms or shapes corresponding to each other, e.g., congruent with each other. For example, the pads 13 and the bumps 23 may be provided in forms or shapes in which they extend to a greater degree or are elongated in a lengthwise direction, as shown in FIG. 2.

Figure 4:
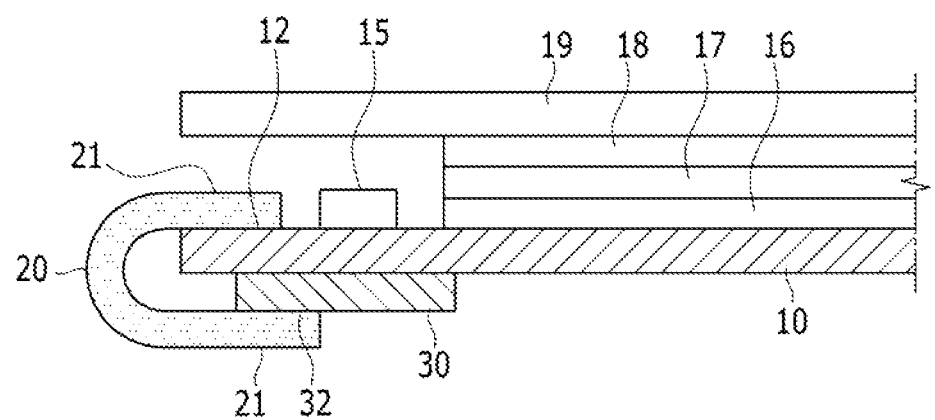
FIG. 4 illustrates a cross-sectional view showing the structure of the display device according to an exemplary embodiment.

The PCB 30 may be attached to the FPC 20 at an end or portion of the FPC 20 that is opposite to the end or portion of the FPC 20 that is attached to the substrate 10, by a pad part 32 (See FIG. 4).

The pad part 32 of the PCB 30 may have the same structure as that of the pad part 12 of the substrate 10.

For example, the pad part 32 of the PCB 30 may include a plurality of pads, the FPC 20 may include bumps, and the pads and bumps may be on facing surfaces to be attached or coupled to each other.

An anisotropic conductive film may be filled in attachment portions between the FPC 20 and the PCB 30 and may then be hardened to electrically connect the bumps of the FPC 20 with the pads of the PCB 30.

FIG. 4 illustrates a cross-sectional view showing the structure of the display device according to an exemplary embodiment.

Referring to FIG. 4, the FPC 20 may have one end portion attached to an upper surface of the outer side portion of the substrate 10 and another end portion attached to the PCB 30, such that it is bent toward or around a lower surface of the substrate 10. For example, the other end portion of the FPC 20 (and the PCB 30 attached to the other end portion of the FPC 20) may be positioned on the lower surface of the substrate 10.

In an implementation, the display device 100 according to an exemplary embodiment may be an organic light emitting diode device in which the display part 11 may include an organic light emitting diode (OLED).

Referring to FIG. 4, the display device 100 may include the flexible substrate 10 and an organic light emitting diode layer on the substrate 10, a thin film encapsulation layer 16 covering and protecting the organic light emitting diode layer, and a functional layer (including a polarization layer 17, a touch panel 18, or the like) on the thin film encapsulation layer 16.

A transparent window layer 19, which is the outermost portion of the display device 100, may be provided on the functional layer.

In an implementation, the display device 100 may be a liquid crystal display (LCD) (in which a display part includes a liquid crystal panel), a plasma display panel (PDP), a filed effect display (FED), or an electrophoretic display device.

In an implementation, the display device 100 according to an exemplary embodiment may be a flexible display device that may include the flexible substrate 10 to thereby be, e.g., bent, folded, or rolled.

For example, in the case in which the substrate 10 is bent, stress may be applied to the FPC 20 attached to the substrate 10, such that adhesion between the substrate 10 and the FPC 20 could be affected. According to an embodiment, the FPC 20 may be provided with a structure or mechanism for decreasing or otherwise compensating for the stress.

According to an exemplary embodiment, as shown in FIG. 2, slits 22 may be formed or provided in the attachment part 21 of the FPC 20.

In an implementation, as shown in FIG. 2, slits may also be formed or provided in the attachment part of the FPC 20 that is attached to the PCB 30 as well as the attachment part 21 of the FPC 20 that is attached to the substrate 10.

Although the attachment part 21 of the FPC 20 that is attached to the substrate 10 will be described below by way of example for convenience of explanation, this description may also be similarly applied to the attachment part of the FPC 20 that is attached to the PCB 30.

Referring to FIG. 2, the slits 22 may be provided in a shape or form such that they cut into the attachment part 21 and divide or separate the attachment part 21 into a plurality of parts.

In an implementation, the slits 22 may be formed between the bumps 22 or between the pads 13.

In an implementation, two slits 22 may be formed, as shown in FIG. 2. In an implementation, the number of slits 22 may be determined in consideration of, e.g., a size of the attachment part 21, a level in which the substrate 10 is curved, or the like, and may be at least one.

As described above, the slits 22 in the attachment part 21 may help decrease stress applied to the attachment part 21 when the substrate 10 is bent.

Figure 5:
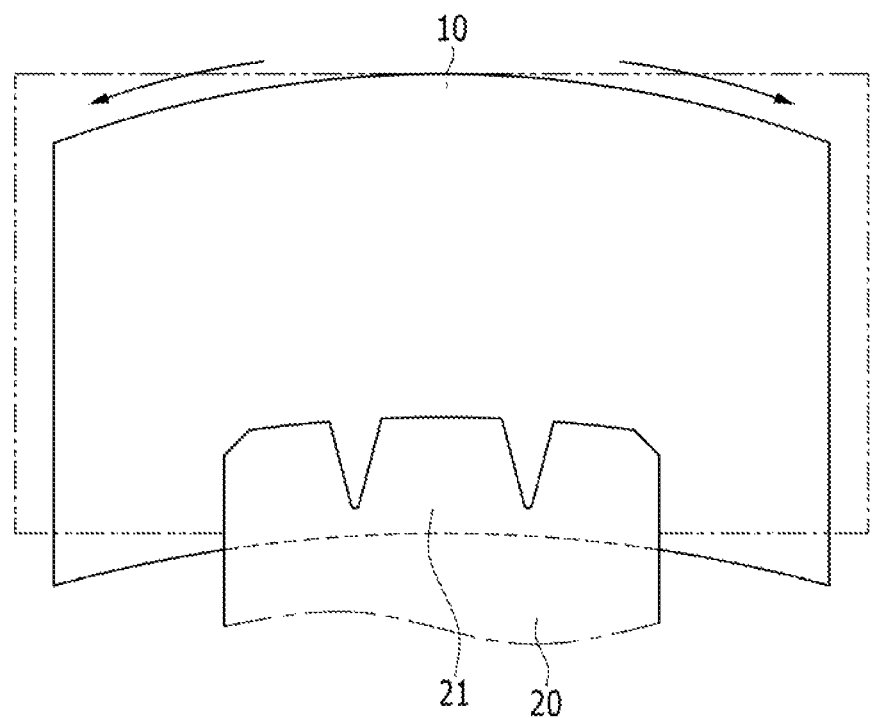
FIG. 5 illustrates a view showing a form in which a substrate of the display device according to an exemplary embodiment is curved.
Figure 6:
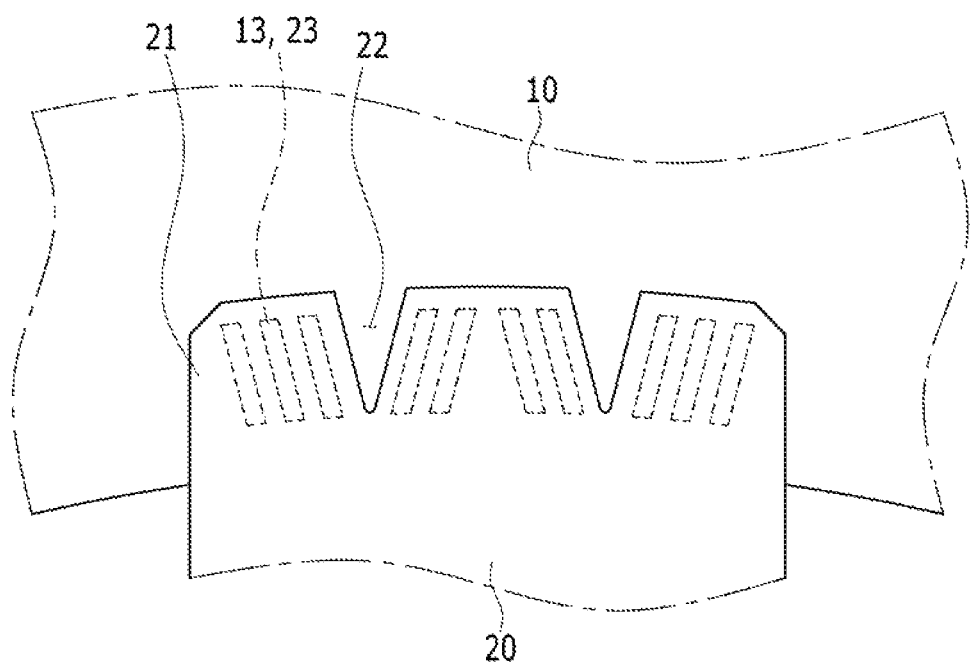
FIG. 6 illustrates a view showing an attachment part of a flexible printed circuit (FPC).

FIG. 5 illustrates a view showing a form in which a substrate of the display device according to an exemplary embodiment is curved. FIG. 6 illustrates a view showing an attachment part of an FPC.

Referring to FIG. 5, the substrate of the display device may have flexibility, may be formed or bent into a curved form, and the display device may be, e.g., a display device having a curved form.

In an implementation, the attachment part 21 of the FPC 20 may be positioned in a region in which the substrate 10 is curved.

For example, in the case in which left and right sides of the substrate 10 are curved, as illustrated in FIG. 5, the attachment part 21 of the FPC 20 may be positioned at upper and lower edge portions of the substrate 10.

For example, as the substrate 10 is curved, stress in a horizontal direction may be applied to the attachment part 21.

For example, when stress is applied to the substrate 10 in an inward direction, as illustrated in FIG. 5, stress may be applied to the attachment part 21 of one end of the FPC 20 in an outward direction, which is an opposite direction to a direction in which the stress is applied to the substrate 10.

Here, referring to FIGS. 4 and 5, the attachment part 21 of the other end of the FPC 20 may also be positioned in a region in which the substrate 10 is curved, and stress may be applied to the attachment part 21 of the other end of the FPC 20.

Referring to FIG. 6, when the stress in the horizontal direction is applied to the attachment part 21 of the FPC 20, the slits 22 formed in a vertical direction (e.g., crossing the stress direction) in the attachment part 21 may interrupt the stress, thereby making it possible to decrease the stress applied to the attachment part 21.

According, it is possible to help reduce and/or prevent weakening of the adhesion between the attachment part 21 of the FPC 20 and the substrate 10.

In an implementation, as shown in FIG. 6, the slits 22 may be formed in a wedge shape, e.g., in which sides, e.g., both sides, thereof are inclined or form an acute angle relative to one another and/or relative to an edge of the FPC 20.

In an implementation, the pads 13 and the bumps 23 may be arranged to be inclined so as to correspond to forms of the slits 22 adjacent thereto. For example, some of the pads 13 and/or bumps 23 may extend or be elongated to be parallel with sides of the slits 22.

When the substrate 10 is curved, the stress may be applied to the FPC 20, such that the pads 13 and the bumps 23 could be partially deformed or partially moved. Therefore, misalignment of the pads 13 and the bumps 23 could occur.

Thus, the possibility that a connection defect occurs may increase. Therefore, it may be important, during the attachment between the substrate 10 and the FPC 20, to align the pads 13 and the bumps 23 with each other.

As shown in FIG. 6, in the case in which the pads 13 and the bumps 23 are arranged or extend in an inclined manner, misalignment of the pads 13 and the bumps 23 may be relatively decreased, even if the pads 13 and the bumps 23 were to be partially deformed or partially moved, as compared with in a case in which the pads 13 and the bumps 23 are arranged in parallel with each other (in a purely vertical direction) without being inclined.

For example, if the pads 13 and the bumps 23 were to be arranged in parallel with each other in the vertical direction without being inclined, if the pads 13 and the bumps 23 are even slightly deformed or moved in the horizontal direction, facing or overlapped areas between the pads 13 and the bumps 23 could be significantly decreased, such that the pads 13 and the bumps 23 could be significantly misaligned with each other.

In contrast, in the case in which the pads 13 and the bumps 23 are arranged to be inclined, even if the pads 13 and the bumps 23 were to be slightly deformed or moved in the horizontal direction, overlapped areas between the pads 13 and the bumps 23 may be only relatively slightly decreased, thereby making it possible to decrease a level in which the pads 13 and the bumps 23 are misaligned with each other.

In an implementation, forms or shapes of the above-mentioned slits 22 and the pads 13 and the bumps 23 depending on the slits may be variously changed.

Figure 7:
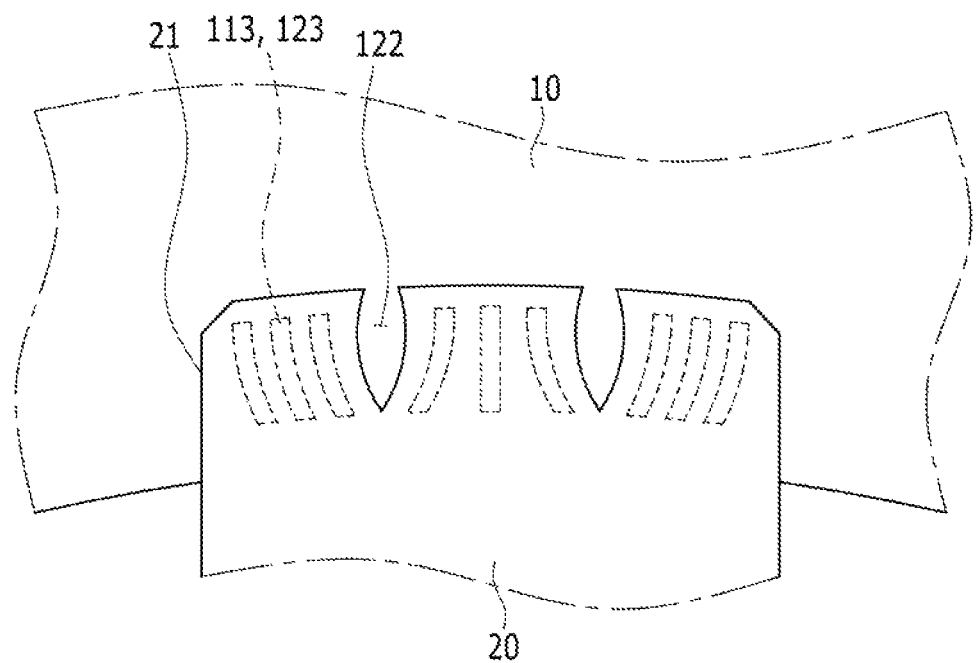
FIG. 7 illustrates a view showing another form of an attachment part of an FPC.
Figure 8:
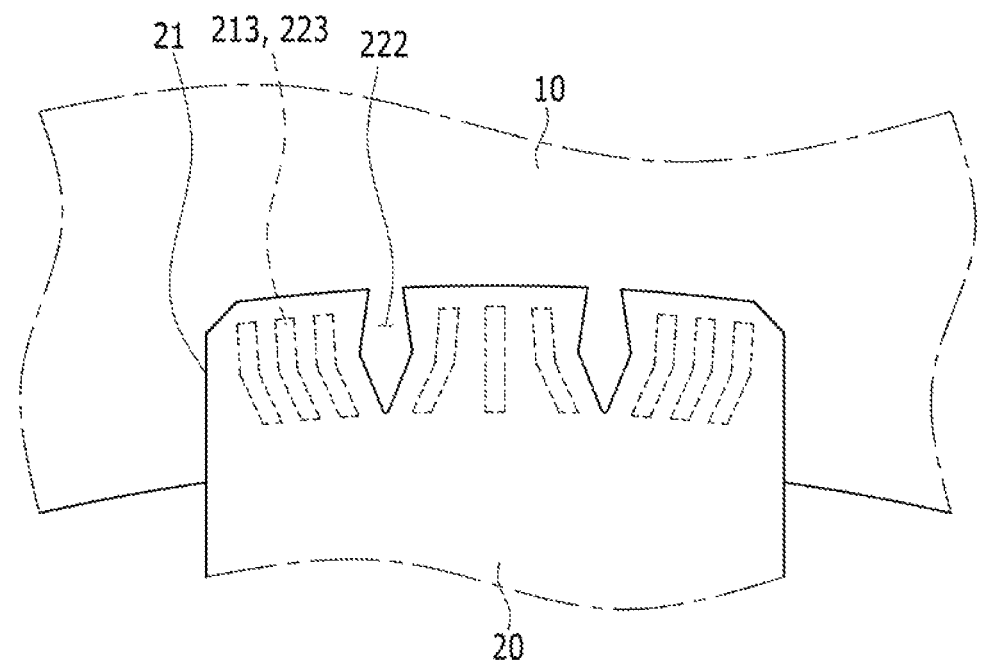
FIG. 8 illustrates a view showing still another form of an attachment part of an FPC.

FIG. 7 illustrates a view showing another form or shape of an attachment part of an FPC. FIG. 8 illustrates a view showing still another form or shape of an attachment part of an FPC.

According to another exemplary embodiment, as shown in FIG. 7, slits 122 may be formed or provided in a substantially oval or elliptical shape.

For example, the slits 122 having the oval shape may have a form in which long sides thereof are curved, and may be disposed or extend in a generally vertical direction.

In an implementation, some of the pads 113 and bumps 123 adjacent to the slits 122 may be formed or provided in a curved shape so as to correspond to the oval or elliptical shape, e.g., to correspond with curved sides of the slits 122.

According to still another exemplary embodiment, as shown in FIG. 8, slits 222 may be formed in a rhombic, parallelogram, or substantially polygonal shape.

Here, the slits 222 having the rhombic or parallelogram shape may have sides that generally extend lengthwise in the generally vertical direction.

In an implementation, some of the pads 213 and bumps 223 adjacent to the slits 222 may be formed or provided in a bent shape so as to correspond to the rhombic, parallelogram, or polygonal shape, e.g., to correspond with bent sides of the slits 222.

Various forms or shapes of the slits, the pads, and the bumps as described above may be changed by a direction in which the substrate 10 is curved, an angle at which the substrate 10 is curved, or the like. In an implementation, the slits may have various suitable forms or shapes that cut or extend into the attachment part 21 of the FPC 20 so as to divide the attachment part 21.

As described above, the display device according to an exemplary embodiment may be the display device having the flexibility and the curved form.

For example, the FPC 20 may be attached to the flexible substrate 10 of the display device, and the slits 22 (having a form in which they cut into the attachment part 21 of the FPC 20 so as to divide the attachment part 21) may be formed in the attachment part 21, thereby making it possible to decrease the stress applied to the attachment part 21 of the FPC 20 when the substrate 10 is curved.

Therefore, a decrease in the adhesion and a connection defect between the substrate 10 and the FPC 20 may be reduced and/or prevented.

By way of summation and review, in the case in which a flexible substrate is curved, stress may be applied to the FPC attached to the substrate due to deformation of the substrate. In this case, a difference may be generated between stress applied to the substrate and the stress applied to the FPC. Thus, connection arrays between the bumps of the FPC connected to the pads formed on the substrate could be misaligned with each other. In addition, adhesion between the substrate and the FPC may suffer. As a result, a connection defect between the substrate and the FPC could occur.

The embodiments may provide a display device including a flexible substrate.

The embodiments may provide a display device having advantages of decreasing stress generated in a flexible printed circuit attached to a substrate when the substrate is curved.

As described above, in the display device according to an embodiment, the slits may be formed in the attachment part of the FPC attached to the substrate, thereby making it possible to decrease stress applied to the FPC when the substrate is curved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of symbols>

| | |
|---|---|
| 10 substrate | 11 display part |
| 12 pad part of substrate | 13, 113, 213 pad |
| 15 driving IC | 16 thin film encapsulation layer |
| 17 polarization layer | 18 touch panel |
| 19 window layer | 20 FPC |
| 21 attachment part | 22, 122, 222 slit |
| 23, 123, 223 bump | 30 PCB |
| 32 pad part of PCB | 50 anisotropic conductive film |
| 51 polymer | 52 conductive particle |
| 100 display device | |

What is claimed is:

1. A display device, comprising:
   a substrate that includes a display part to display an image;
   a driving integrated chip (IC) that supplies a driving voltage to the display part;
   a flexible printed circuit (FPC) attached to the substrate; and
   a printed circuit board (PCB) attached to the FPC, the PCB transferring the driving voltage to the driving IC through the FPC, wherein:
   the FPC includes a first attachment part having a first pad, a second attachment part having a second pad, and a slit between the first attachment part and the second attachment part, the slit being formed along a first direction, the first pad of the first attachment part and the second pad of the second attachment part of the FPC being attached to pad parts of the substrate, wherein
   the first pad of the first attachment part and the second pad of the second attachment part are adjacent to each other, and are inclined at different angles relative to the first direction, wherein:
   the FPC further includes a third attachment part, a fourth attachment part, and another slit between the third attachment part and the fourth attachment part, the another slit being formed along the first direction, and pads of the third attachment part and the fourth attachment part are attached to pad parts of the PCB, and wherein
   the pads of the third attachment part and the fourth attachment part of the FPC attached to the pad parts of the PCB are inclined at different angles relative to the first direction.

2. The display device as claimed in claim 1, wherein the first attachment part and the second attachment part are separated from each other by the slit.

3. The display device as claimed in claim 2, wherein:
   the first pad of the first attachment part and the second pad of the second attachment part extend in a lengthwise direction,
   the pad parts include a third pad and a fourth pad, the third pad having a shape corresponding to a shape of the first pad and being attached to the first pad, the fourth pad having a shape corresponding to a shape of the second pad and being attached to the second pad, and
   the slit is between the first pad of the first attachment part and the second pad of the second attachment part.

4. The display device as claimed in claim 3, wherein extension directions of the first pad and the second pad are inclined relative to an edge of the FPC.

5. The display device as claimed in claim 1, wherein:
the slit has sides that are inclined relative to one another, and
extension directions of the first pad and the second pad are respectively parallel with the sides of the slit adjacent to the first pad and the second pad.

6. The display device as claimed in claim 3, wherein:
the slit has a elliptical shape having curved sides, and
at least one of the first pad and the second pad is curved so as to correspond to the curved sides of the slit adjacent thereto.

7. The display device as claimed in claim 3, wherein:
the slit has a polygonal shape having bent sides, and
at least one of the first pad and the second pad is bent so as to correspond to the bent sides of the slit adjacent thereto.

8. The display device as claimed in claim 1, wherein the pad parts and the first attachment part and the second attachment part are electrically connected to each other by an anisotropic conductive film (ACF).

9. The display device as claimed in claim 1, wherein one end of the FPC is on one surface of the substrate and another end of the FPC is on another, opposite surface of the substrate.

10. The display device as claimed in claim 1, wherein the first attachment part and the second attachment part are attached to the substrate in a region in which the substrate is curved.

11. The display device as claimed in claim 1, wherein the driving IC is positioned at an outer side portion of the substrate.

12. The display device as claimed in claim 1, wherein the display device is any one of a liquid crystal display (LCD), a plasma display panel (PDP), an organic light emitting diode (OLED) device, a field effect display (FED), and an electrophoretic display device.

13. The display device as claimed in claim 1, wherein:
the display device has a curved shape or has flexibility, and
the substrate is flexible.

14. The display device as claimed in claim 1, wherein:
the first pad of the first attachment part and the second pad of the second attachment part are symmetrical regarding a line crossing the slit and extending in the first direction.

* * * * *